United States Patent [19]

Matsubara et al.

[11] Patent Number: 5,084,438
[45] Date of Patent: Jan. 28, 1992

[54] ELECTRONIC DEVICE SUBSTRATE USING SILICON SEMICONDUCTOR SUBSTRATE

[75] Inventors: Shogo Matsubara; Yoichi Miyasaka; Sadahiko Miura, all of Tokyo, Japan

[73] Assignee: NEC Corporation, Tokyo, Japan

[21] Appl. No.: 326,783

[22] Filed: Mar. 21, 1989

[30] Foreign Application Priority Data

Mar. 23, 1988 [JP] Japan .................................. 63-70597
Mar. 23, 1988 [JP] Japan .................................. 63-70598

[51] Int. Cl.$^5$ ................................................ B32B 9/00
[52] U.S. Cl. .................................. 505/1; 505/701; 505/702; 505/703; 505/704; 428/426; 428/432; 428/433; 428/688; 428/700; 428/901; 428/930
[58] Field of Search ............................ 505/1, 701-704; 428/426, 432, 433, 688, 700, 901, 930

[56] References Cited

FOREIGN PATENT DOCUMENTS

| 58-6147 | 1/1983 | Japan . |
| 59-26999 | 2/1984 | Japan . |
| 59-123245 | 7/1984 | Japan . |
| 60-161635 | 8/1985 | Japan . |

OTHER PUBLICATIONS

CA 111 (24): 223259c, Chak et al., 1989, 76–4 Electric Phenomena.
CA 110 (8): 67103u, Miura et al., 1988, Appl. Phys. Letts. 53 (20) 1967-9.
CA 109 (6): 46792g, Nasu et al., 1988, Jp. Journ. Appl. Phys., Part 2, 27 (4) L634-L635.
"Formation of Si Epi./MgO.Al$_2$O$_3$ Epi./SiO$_2$/Si and Its Epitaxial Film Quality" by Masao Mikami et al., Extended Abstracts of the 15th Conference on Solid State Devices and Mateials, Tokyo 1983, pp. 31-34.

Primary Examiner—Patrick J. Ryan
Attorney, Agent, or Firm—Burns, Doane, Swecker & Mathis

[57] ABSTRACT

An electronic device substrate includes a spinel epitaxial film formed on a silicon single-crystal substrate and an oxide superconductor layer formed on the spinel film. The oxide superconductor layer is represented by formula $P_x(Q,Ca)_yCu_zO_\delta$ and contains at least one element of Bi and Tl as P and at least one element of Sr and Ba as Q. Composition ratios fall within ranges of $0.08 \leq x/(x+y+z) \leq 0.41$, $0.29 \leq y/(x+y+z) \leq 0.47$ and $1 \leq Q/Ca \leq 3$.

10 Claims, 3 Drawing Sheets

ELECTRONIC DEVICE SUBSTRATE USING SILICON SEMICONDUCTOR SUBSTRATE

Background of the Invention

The present invention relates to an electronic device substrate comprising a semiconductor layer, an insulator layer and an oxide superconductor layer.

A Bi-Sr-Ca-Cu-O-based or Tl-Ba-Ca-Cu-O-based oxide is a high-temperature superconducting material having a critical temperature $T_c$ higher than a liquid nitrogen temperature depending on a composition. An Nb-based alloy conventionally used as a superconducting material requires expensive liquid helium for cooling. The Bi-Sr-Ca-Cu-O-based or Tl-Ba-Ca-Cu-O-based oxide, however, can be cooled with inexpensive liquid nitrogen and therefore has attracted much attention as an industrially practical material.

A thin film device has been studied as an application of the high-temperature superconducting material to an electronic device, and thin film formation of the Bi-Sr-Ca-Cu-O-based or Tl-Ba-Ca-Cu-O-based material has progressed. A silicon semiconductor is mainly used as a current electronic device. Therefore, if the Bi-Sr-Ca-Cu-O-based or Tl-Ba-Ca-Cu-O-based high-temperature superconducting material is formed on a silicon single-crystal substrate, a superconducting device with high performance and packing density can be developed by using advanced silicon semiconductor techniques. No prior art has been reported yet, however, about thin film formation of the Bi-Sr-Ca-Cu-O-based or Tl-Ba-Ca-Cu-O-based high-temperature superconducting material on a silicon substrate.

As described above, various electronic devices have been fabricated on a silicon substrate and put into practical use. Therefore, if a thin film of an oxide superconductor is realized on a silicon substrate, the film can be used together with the various Si devices, resulting in a great practical advantage. As is well known, however, when a thin film of an oxide superconductor is formed on a silicon substrate, problems of crack formation and film peeling arise due to a difference in thermal expansion coefficients between the silicon substrate and the oxide superconductor.

In addition, in order to form wiring between semiconductor devices formed on a silicon substrate by using a superconducting material, the silicon substrate and the superconducting wiring layer must be insulated from each other. A method for this purpose, however, has not been reported yet.

SUMMARY OF THE INVENTION

It is an object of the present invention to provide an electronic device substrate comprising an oxide superconductor thin film.

That is, the present invention provides an electronic device substrate, wherein a spinel film is formed on a silicon single-crystal substrate, and an oxide superconductor layer represented by formula $P_x(Q,Ca)_y Cu_z O_\delta$ and containing at least one element of Bi and Tl as P and at least one element of Sr and Ba as Q, composition ratios falling within ranges of $0.08 \leq x/(x+y+z) \leq 0.41$, $0.29 \leq y/(x+y+z) \leq 0.47$ and $1 \leq Q/Ca \leq 3$, is formed on the spinel film.

Assuming that the spinel is represented by $AAl_2O_4$, A is preferably a transition metal of, e.g., Fe, Co, Ni or Mn, or Mg or the like. This is because a difference in lattice constants and that in thermal expansion coefficients are reduced. When the spinel of $AAl_2O_4$ is used, Al tends to diffuse and change the composition of an oxide superconductor, and the superconductivity may be lost. Therefore, it is preferred to use MgO as a diffusion barrier between the spinel and the oxide superconductor. Note that an Si/MgO/MgAlO$_4$/Si substrate structure of an Si device is disclosed in Japanese Patent Laid-Open No. 59-123245.

In addition, Japanese Patent Laid-Open No. 58-6147 discloses that the crystallinity of an $MgAl_2O_4$ epitaxial film formed on an Si substrate can be improved by thermally oxidizing the Si substrate via the grown $MgAl_2O_4$ film to obtain an $MgAl_2O_4/SiO_2/Si$ structure. Therefore, the insulator single-crystal film may be formed on an Si single-crystal substrate via amorphous $SiO_2$.

On the insulator single-crystal film having such good crystallinity, a high-temperature superconductor film represented by formula $Bi_x(Sr,Ca)_y Cu_z O_\delta$ or $Tl_x(Ba,Ca)_y Cu_z O_\delta$, free from crack formation, and having a critical temperature $T_c$ equivalent to that of bulk ceramic can be formed. In the present invention, the thermal expansion coefficient of the insulator single-crystal film is larger than any of $8.8 \times 10^{-6}$ K$^{-1}$ of $MgAl_2O_4$, $13.8 \times 10^{-6}$ K$^{-1}$ of MgO and $4.2 \times 10^{-6}$ K$^{-1}$ of Si. It can be assumed that the thermal expansion coefficient of $Bi_x(Sr,Ca)_y Cu_z O_\delta$ or $Tl_x(Ba,Ca)_y Cu_z O_\delta$ is equivalent to that of $YBa_2Cu_3O_{7-\delta}$ which is also an oxide high-temperature superconducting material, it is considered to be about 14 to $25 \times 10^{-6}$ K$^{-1}$. Therefore, in the present invention, the $MgAl_2O_4$,MgO single-crystal film reduces an internal strain of the film induced due to a thermal expansion difference between the silicon substrate and the $Bi_x(Sr,Ca)_y Cu_z O_\delta$-based or $Tl_x(Ba,Ca)_y Cu_z O_\delta$-based film and prevents crack formation. That is, by gradually changing the thermal expansion coefficient, the internal strain induced by a difference in thermal expansion coefficients between the Si substrate and the superconductor can be relaxed.

In addition, since the insulator film formed on the silicon substrate is a single-crystal film, the $Bi_x(Sr,Ca)_y Cu_z O_\delta$ or $Tl_x(Ba,Ca)_y Cu_z O_\delta$ superconductor film can have a critical temperature $T_c$ equivalent to that of the bulk ceramics. That is, the critical temperature $T_c$ of the high-temperature superconducting material is sensitive to a composition. Therefore, in the case of a thin film, it is important to prevent mutual diffusion between the film and a substrate in order to obtain a critical temperature $T_c$ equivalent to that of bulk ceramic. In a polycrystalline film, a grain boundary is a high-speed diffusion path. Therefore, when a film is formed on the polycrystalline film, mutual diffusion apts to occur via the grain boundary exposed on the surface. Therefore, since the insulator film formed on the silicon substrate is a single-crystal film, mutual diffusion between the film and the $Bi_x(Sr,Ca)_y Cu_z O_\delta$ or $Tl_x(Ba,Ca)_y Cu_z O_\delta$ film formed thereon can be effectively prevented. Also, high melting points 2,408K and 3,008K of $MgAl_2O_4$ and MgO, respectively, effectively prevent the above mutual diffusion.

In the present invention, since the high-temperature superconducting film is formed on an Si substrate, a superconducting device can have a high performance by using advanced Si semiconductor IC techniques. For example, a field effect superconductive transistor using the superconductor film as source and drain electrodes or an LSI having superconducting wiring can be developed. That is, the present invention has an important effect.

A perovskite compound may be formed between the spinel or MgO and the oxide superconductor.

The dielectric film formed on the above insulator film is a single-crystal film having a perovskite crystal structure represented by formula $ABO_3$. A method of manufacturing such a dielectric film is disclosed in Japanese Patent Laid-Open No. 60-161635. The dielectric single-crystal film serves as a buffer layer when a high-temperature superconductor film represented by formula $P_x(Q,Ca)_yCu_z$ is to be formed. In general, since substitutive solid solution of the $ABO_3$-type perovskite oxide can be performed in a wide composition range by various elements, a lattice constant can be arbitrarily controlled to some extent by substitutive solid solution. Therefore, a superconductor single-crystal film can be fabricated with high crystallinity by obtaining matching between a lattice constant of the dielectric film and that of the superconductor film.

The perovskite is used for the following reason. That is, the spinel film and the dielectric film of the present invention also serve to prevent crack formation or film peeling due to a difference in thermal expansion coefficients between the $Bi_x(Sr,Ca)_yCu_zO_\delta$ or $Tl_x(Sr,Ca)_yCu_zO_\delta$ film and the Si substrate formed thereon. Thermal expansion coefficients of the spinel and insulator films are $MgAl_2O_4 = 8.8 \times 10^{-6} K^{-1}$, $MgO = 13.8 \times 10^{-6} K^{-1}$, and $ABO_3$-type perovskite oxide = 10 to $14 \times 10^{-6} K^{-1}$. Any of these values is larger than thermal expansion coefficient $4.2 \times 10^{-6} K^{-1}$ of Si. The thermal expansion coefficient of $Bi_x(Sr,Ca)_yCu_zO_\delta$ or $Tl_x(Sr,Ca)_yCu_zO_\delta$ can be assumed to be equivalent to that of $YBa_2Cu_3O_{7-\delta}$ which is also an oxide high-temperature superconducting material, i.e., about 14 to $25 \times 10^{-6} K^{-1}$.

That is, by gradually changing the thermal expansion coefficient, an internal strain of the film induced due to a difference in thermal expansion coefficients between the Si substrate and the $Bi_x(Sr,Ca)_yCu_zO_\delta$ or $Tl_x(Sr,Ca)_yCu_zO_\delta$ film can be relaxed, thereby preventing crack formation.

DETAILED DESCRIPTION OF THE PREFERRED EMBODIMENTS

The present invention will be described in detail below by way of its examples with reference to the accompanying drawings.

EXAMPLE 1

Figure 1A:
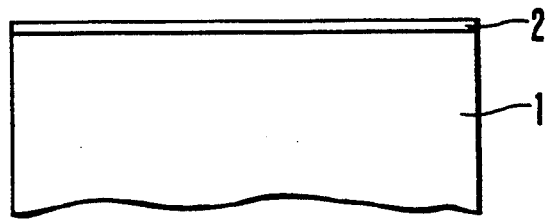
FIGS. 1A to 3 are sectional views showing a manufacturing process of a substrate according to the present invention.
Figure 1B:
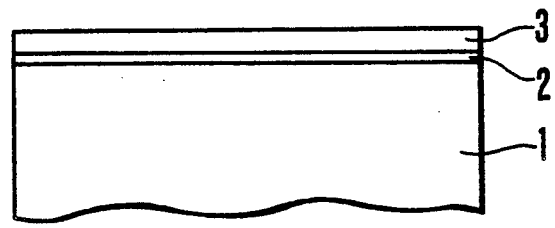

$MgAl_2O_4$ was epitaxially grown on a (100) Si single-crystal substrate, and $Bi_x(Sr,Ca)_yCu_zO_\delta$ was formed thereon by sputtering. FIGS. 1A and 1B show manufacturing steps of this example. As shown in FIG. 1A, an $MgAl_2O_4$ epitaxial film 2 was grown on a (100) Si single-crystal substrate 1 by epitaxial growth. As shown in FIG. 1B, a $Bi_x(Sr,Ca)_yCu_zO_\delta$ film 3 was formed on the $MgAl_2O_4$ film 2 by sputtering. Epitaxial growth of the $MgAl_2O_4$ film was performed by a method disclosed in Japanese Patent Laid-Open No. 59-26999. That is, an $MgCl_2$ gas, an $AlCl_3$ gas obtained by reacting Al with HCl, a $CO_2$ gas and an $H_2$ gas were used as reaction gases, and an $N_2$ gas was used as a carrier. A production reaction of $MgAl_2O_4$ is represented as follows:

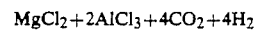

$MgCl_2 + 2AlCl_3 + 4CO_2 + 4H_2$

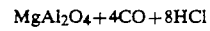

$MgAl_2O_4 + 4CO + 8HCl$ $MgAl_2O_4$ was grown to have a thickness of 0.1 μm at a growth temperature of 950° C., and it was confirmed by X-ray diffraction and electron beam diffraction that (100) $MgAl_2O_4$ was epitaxially grown. The $Bi_x(Sr,Ca)_yCu_zO_\delta$ film was fabricated to have a thickness of 1 μm by RF magnetron sputtering. Powders were prepared by mixing oxides to obtain compositions listed in Table 1. The resultant mixtures were calcined at 800° C. and used as targets to perform film formation in an Ar-$O_2$ gas mixture at a substrate temperature of 700° C. After film formation, changes in electrical resistance of the $Bi_x(Sr,Ca)_yCu_zO_\delta$ upon temperature changes were measured by a four-probe method, and critical temperatures listed in Table 1 were obtained.

Although the $Bi_x(Sr,Ca)_yCu_zO_\delta$ film whose composition falls within the above range consists of both a superconducting substance and a nonsuperconducting substance, the film has superconductivity with good reproducibility as a whole because a volume ratio of the superconducting substance is larger. If the composition of the $Bi_x(Sr,Ca)_yCu_zO_\delta$ film does not fall within the above range, however, a volume ratio of the nonsuperconducting substance becomes larger, and the film exhibits semiconducting or insulating electrical characteristics. Therefore, the composition of the $Bi_x(Sr,Ca)_yCu_zO_\delta$ film preferably falls within the ranges of $0.08 \leq x/(x+y+z) \leq 0.41$, $0.29 \leq y/(x+y+z) \leq 0.47$ and $1 \leq Sr/Ca \leq 3$.

TABLE 1

| | Bi (%) | Sr + Ca (%) | Cu (%) | Sr/Ca | $T_c$ (K) |
| --- | --- | --- | --- | --- | --- |
| 1 | 8 | 47 | 45 | 1.5 | 54K |
| 2 | 8 | 29 | 63 | 1.5 | 47K |
| 3 | 41 | 29 | 30 | 1.5 | 68K |
| 4 | 41 | 47 | 12 | 1.5 | 59K |
| 5 | 41 | 40 | 30 | 1.0 | 85K |
| 6 | 30 | 40 | 30 | 1.0 | 80K |
| 7 | 30 | 40 | 30 | 3.0 | 67K |
| 8 | 20 | 40 | 40 | 1.0 | 85K |
| 9 | 20 | 40 | 40 | 1.5 | 72K |

EXAMPLE 2

An Si substrate was thermally oxidized via a 0.1-μthick $MgAl_2O_4$ film epitaxially grown on a (100) Si single-crystal substrate to form $SiO_2$ having a thickness of 0.5 μm between the $MgAl_2O_4$ film and the Si substrate, and $Bi_x(Sr,Ca)_yCu_zO_\delta$ was grown on the $MgAl_2O_4$ epitaxial film to have a thickness of 1 μm.

Figure 2A:
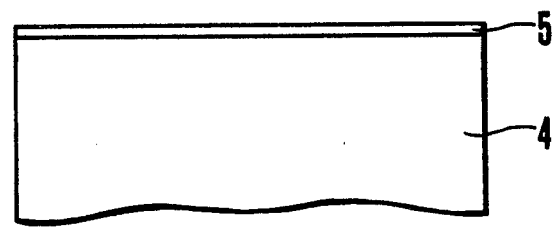
Figure 2B:
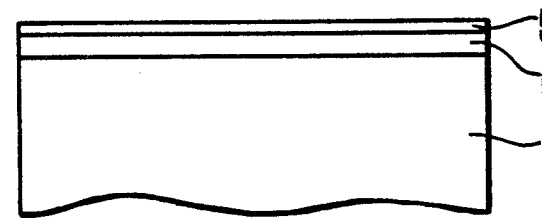
Figure 2C:

FIGS. 2A to 2C are manufacturing steps of this example. As shown in FIG. 2A, an $MgAl_2O_4$ epitaxial film 5 was formed on a (100) Si substrate 4 similar to that used in Example 1. As shown in FIG. 2B, an $SiO_2$ film 6 was formed between the Si substrate 4 and the film 5 by thermal oxidation. In this case, thermal oxidation was steam oxidation performed at 1,100° C. A $Bi_x(Sr,Ca)_yCu_zO_\delta$ film was then formed on the $MgAl_2O_4$ film 5.

By thermal oxidation, a full-width at half maximum of an X-ray rocking curve of the $MgAl_2O_4$ film was reduced by 30%, and its crystallinity was improved. $MgAl_2O_4$ and $Bi_x(Sr,Ca)_yO_\delta$ were grown following the same procedures as in Example 1. In any composition, a critical temperature characteristic as in Example 1 was obtained.

EXAMPLE 3

Figure 3:
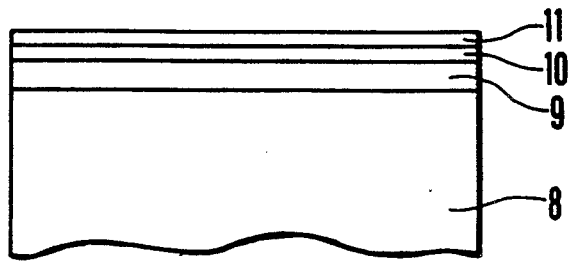

A 800-Å thick $MgAl_2O_4$ film was epitaxially grown on a (100) Si single-crystal substrate, and a 0.5-μm thick MgO film was epitaxially grown thereon. Thereafter, a 2-μm thick $Bi_x(Sr,Ca)_yCu_zO_\delta$ film was grown following the same procedures as in Example 1. In any composition, a critical temperature as in Example 1 was obtained. FIG. 3 shows a structure according to this example. Referring to FIG. 3, reference numeral 8 denotes an Si single-crystal substrate; 9, an $MgAl_2O_4$ epitaxial film; 10, an MgO epitaxial film; and 11, a $Bi_x(Sr,Ca)_yCu_zO_\delta$ film.

It was confirmed that the same effect could be obtained by forming $Bi_x(Sr,Ca)_yCu_zO_\delta$ on a substrate consisting of $MgO/MgAl_2O_4/SiO_2/Si$ single-crystal.

EXAMPLE 4

A $Tl_x(Ba,Ca)_yCu_zO_\delta$ film was epitaxially grown in place of a $Bi_x(Sr,Ca)_yCu_zO_\delta$ film following the same procedures as in Example 1. Growth was performed following the same procedures as in Example 1, and a 1-μm thick film was prepared by an RF magnetron sputtering method. Powders were prepared by mixing oxides to obtain compositions listed in Table 2, and the resultant mixtures were calcined at 850° C. and used as targets to perform film formation in an $Ar-O_2$ gas mixture at a substrate temperature of 700° C. After film formation, changes in electrical resistance of the $Tl_x(Ba,Ca)_yCu_zO_\delta$ film upon temperature changes were measured by a four-probe method, and superconducting characteristics of critical temperatures listed in Table 2 were obtained.

TABLE 2

| | Tl (%) | Ba + Ca (%) | Cu (%) | Ba/Ca | $T_c$ (K) |
|---|---|---|---|---|---|
| 1 | 30 | 40 | 30 | 1.5 | 87K |
| 2 | 20 | 40 | 40 | 1.0 | 88K |
| 3 | 8 | 47 | 45 | 1.5 | 52K |

EXAMPLE 5

Figure 4A:
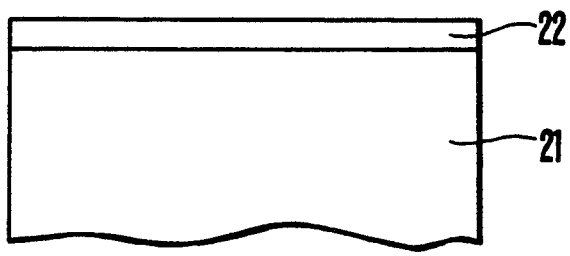
FIGS. 4A to 6 are sectional views showing a manufacturing process of a substrate according to the present invention.
Figure 4B:
Figure 4C:
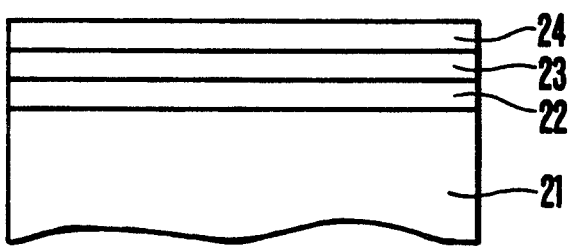

As shown in FIG. 4A, an $MgAl_2O_4$ film 22 was epitaxially grown on a (100) Si single-crystal substrate 21. As shown in FIG. 4B, $BaTiO_3$ 23 was epitaxially grown on the resultant structure. As shown in FIG. 4C, $Bi_x(Sr,Ca)_yCu_zO_\delta$ 24 was formed on the $BaTiO_3$ film 23 by sputtering. Epitaxial growth of the $MgAl_2O_4$ film 22 was performed by a method already proposed (Japanese Patent Laid-Open No. 59-26999). That is, an $MgCl_2$ gas, an $AlCl_3$ gas obtained by reacting Al and HCl, a $CO_2$ gas and an $H_2$ gas were used as reaction gases, and an $N_2$ gas was used as a carrier gas, thereby forming $MgAl_2O_4$ by a reaction of $MgCl_2 + 2AlCl_3 + 4CO_2 4H_2 \rightarrow MgAl_2O_4 + 4CO + 8HCl$. The film was grown at a temperature of 950° C. to have a thickness of 0.1 μm. It was confirmed by X-ray diffraction and electron beam diffraction that (100) $MgAl_2O_4$ was epitaxially grown. The $BaTiO_3$ epitaxial film was prepared by a method already proposed (Japanese Patent Laid-Open No. 59-17358). That is, a $BaTiO_3$ powder was used as a target to perform film formation in a 10% $O_2$-Ar gas mixture at a substrate temperature of 600° C. by an RF magnetron sputtering method. The film thickness was 0.4 μm. Similar to $MgAl_2O_4$, it was confirmed by X-ray diffraction and electron beam diffraction that a (100) film was epitaxially grown. The $Bi_x(Sr,Ca)_yCu_zO_\delta$ film was prepared by the RF magnetron sputtering method to have a thickness of 1 μm. Powders were prepared by mixing oxides to obtain compositions listed Table 3, and the resultant mixtures were calcined at 850° C. and used as targets to perform film formation in an $Ar-O_2$ gas mixture at a substrate temperature of 700° C. After film formation, changes in electrical resistance of the $Bi_x(Sr,Ca)_yCu_zO_\delta$ film upon temperature changes were measured by a four-probe method, and superconducting characteristics of critical temperatures $T_c$ listed in Table 3 were obtained.

TABLE 3

| | Bi (%) | Sr + Ca (%) | Cu (%) | Sr/Ca | $T_c$ (K) |
|---|---|---|---|---|---|
| 1 | 8 | 47 | 45 | 1.5 | 56K |
| 2 | 8 | 29 | 63 | 1.5 | 48K |
| 3 | 41 | 29 | 30 | 1.5 | 70K |
| 4 | 41 | 47 | 12 | 1.5 | 60K |
| 5 | 30 | 40 | 30 | 1.5 | 86K |
| 6 | 30 | 40 | 30 | 1.0 | 82K |
| 7 | 30 | 40 | 30 | 3.0 | 69K |
| 8 | 20 | 40 | 40 | 1.0 | 88K |
| 9 | 20 | 40 | 40 | 1.5 | 71K |

Although the $Bi_x(Sr,Ca)_yCu_zO_\delta$ film whose composition falls within the above range consists of both a superconducting substance and a nonsuperconducting substance, the film has superconductivity with good reproducibility as a whole because a volume ratio of the superconducting substance is larger. If the composition of the $Bi_x(Sr,Ca)_yCu_zO_\delta$ film does not fall within the above range, however, a volume ratio of the nonsuperconducting substance becomes larger, and the film exhibits semiconducting or insulating electrical characteristics. Therefore, the composition of the $Bi_x(Sr,Ca)_yC_yO_\delta$ film preferably falls within the ranges of $0.08 \leq x(x+y+z) \leq 0.41$, $0.29 \leq y/(x+y+z) \leq 0.47$ and $1 \leq Sr/Ca \leq 3$.

EXAMPLE 6

A $(Ba,Sr)TiO_3$ film was epitaxially grown in place of $BaTiO_3$ following the same procedures as in Example 5. Growth was performed following the same procedures as in Example 5 by a magnetron sputtering method to form a film having a film thickness of 0.4 μm. A $(Ba_x,Sr_{1-x})TiO_3$ powder was used as a target, and three types of compositions $x = 0.25$, 0.50 and 0.75 were used. A $Bi_x(Sr,Ca)_yCu_zO_\delta$ film was grown on the $(Ba,Sr)TiO_3$ epitaxial film following the same procedures as in Example 5 by an RF magnetron sputtering method. In any composition, the same superconductivity as in Example 5 was obtained.

EXAMPLE 7

An Si substrate was thermally oxidized via an $MgAl_2O_4$ film epitaxially grown on a (100) Si single-crystal substrate, and $SiO_2$ was formed between the $MgAl_2O_4$ film and the Si substrate. Thereafter, a $BaTiO_3$ film was epitaxially grown on the $MgAl_2O_4$ epitaxial film, and $Bi_x(Sr,Ca)_yCu_zO_\delta$ was grown thereon.

Figure 5A:
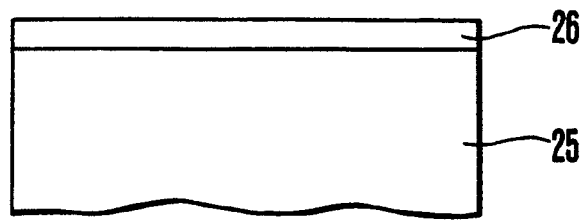
Figure 5B:
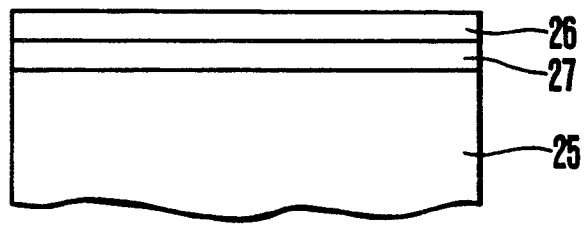
Figure 5C:
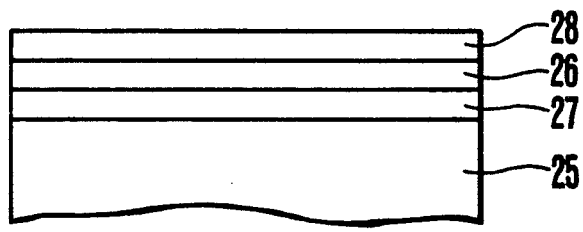
Figure 5D:
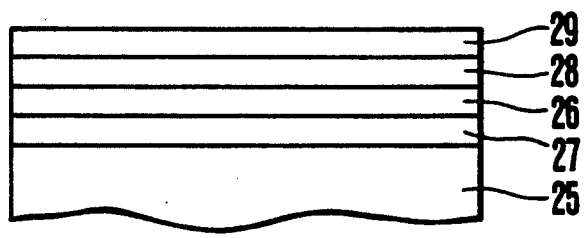

FIGS. 5A to 5D show manufacturing steps of this example. As shown in FIG. 5A, $MgAl_2O_4$ 26 was grown on an Si substrate 25. As shown in FIG. 5B, an $SiO_2$ film 27 was formed between the Si substrate 25 and the $MgAl_2O_4$ 26 by steam oxidation at 1,100° C. As shown in FIG. 5C, a BaTiO$_3$ film 28 was epitaxially grown on the MgAl$_2$O$_4$ 26. As shown in FIG. 5D, a Bi$_x$(Sr,Ca)$_y$Cu$_z$O$_\delta$ film 29 was formed on the film 28. The single-crystalline property of MgAl$_2$O$_4$ was not degraded upon thermal oxidation, but a full-width at half maximum of an X-ray rocking curve was reduced by about 30% to improve the crystallinity. MgAl$_2$O$_4$, BaTiO$_3$ and Bi$_x$(Sr,Ca)$_y$Cu$_z$O$_\delta$ were grown following the same procedures as in Example 1. In any composition, the same superconductivity as in Example 5 was obtained.

EXAMPLE 8

Figure 6:
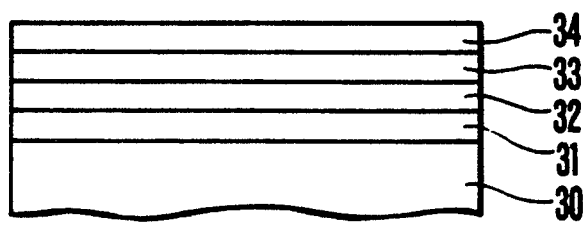

A 0.1-μm thick MgAl$_2$O$_4$ film was epitaxially grown on a (100) Si single-crystal substrate, and 0.1-μm thick MgO was epitaxially grown thereon. Following the same procedures as in Example 5, a 0.4-μm thick BaTiO$_3$ film was epitaxially grown, and a 1-μm thick Bi$_x$(Sr,Ca)$_y$Cu$_z$O$_\delta$ film was grown thereon. FIG. 6 shows a structure of the film according to this example. Referring to FIG. 6, reference numeral 30 denotes an Si single-crystal substrate; 31, an MgAl$_2$O$_4$ epitaxial film; 32, an MgO epitaxial film; 33, a BaTiO$_3$ epitaxial film; and 34, a Bi$_x$(Sr,Ca)$_y$Cu$_z$O$_\delta$ film. In any composition, the same superconductivity as in Example 5 was obtained.

In this case, an SiO$_2$ layer may be formed between the Si single crystal and MgAl$_2$O$_4$.

EXAMPLE 9

A Tl$_x$(Ba,Ca)$_y$Cu$_z$O$_\delta$ film was epitaxially grown in place of a Bi$_x$(Sr,Ca)$_y$Cu$_z$O$_\delta$ film following the same procedures as in Example 5. Growth was performed following the same procedures as in Example 5, and the film having a thickness of 1 μm was prepared by an RF magnetron sputtering method. Powders were prepared by mixing oxides to obtain compositions listed in Table 4, and the resultant mixtures were calcined at 850° C. and used as targets to perform film formation in an Ar-O$_2$ gas mixture at a substrate temperature of 700° C. After film formation, changes in electrical resistance of the Tl$_x$(Ba,Ca)$_y$Cu$_z$O$_\delta$ film upon temperature changes were measured by a four-probe method, and superconducting characteristics of critical temperatures T$_c$ listed in Table 4 were obtained.

TABLE 4

|   | Tl (%) | Ba + Ca (%) | Cu (%) | Ba/Ca | T$_c$ (K) |
|---|---|---|---|---|---|
| 1 | 30 | 40 | 30 | 1.5 | 87K |
| 2 | 20 | 40 | 40 | 1.0 | 86K |
| 3 | 8 | 47 | 45 | 1.5 | 50K |

What is claimed is:

1. An electronic device substrate comprising:
a silicon single-crystal substrate;
a spinel epitaxial film formed on said singlecrystal substrate; and
an oxide superconductor film formed on said spinel film, said oxide superconductor being represented by formula P$_x$(Q,Ca)$_y$Cu$_z$O$_\delta$ and containing at least one element of Sr and Ba as Q, and composition ratios falling within ranges of $0.08 \leq x/(x+y+z) \leq 0.41$, $0.29 \leq y/(x+y+z) \leq 0.47$ and $1 \leq Q/Ca \leq 3$, and wherein δ is a stoichiometric value selected based on the stoichiometric values x, y and z to provide an oxide.

2. An electronic device substrate according to claim 1, wherein said spinel is selected from a group consisting of MgAl$_2$O$_4$, FeAl$_2$O$_4$, CoAl$_2$O$_4$, NiAl$_2$O$_4$ and MnAl$_2$O$_4$.

3. An electronic device substrate according to claim 2, wherein said spinel is MgAl$_2$O$_4$.

4. An electronic device substrate according to claim 2, further comprising an MgO epitaxial film formed between said spinel film and said oxide superconductor film.

5. An electronic device substrate according to claim 3, further comprising an MgO epitaxial film formed between said MgAl$_2$O$_4$ film and said oxide superconductor film.

6. An electronic device substrate according to claim 1, further comprising an SiO$_2$ film formed between said spinel film and said silicon substrate.

7. An electronic device substrate according to claim 2, further comprising an SiO$_2$ film formed between said spinel film and said silicon substrate.

8. An electronic device substrate according to claim 1, further comprising a dielectric film having a perovskite crystal structure represented by formula ABO$_3$ and containing at least one element selected from the group consisting of Pb, Ba, Sr, Mg and a rare-earth element as A and one or both of Ti and Zr as B formed between said spinel epitaxial film and said oxide superconductor film represented by formula P$_x$(Q,Ca)$_y$Cu$_z$O$_\delta$.

9. An electronic device substrate according to claim 4, further comprising a dielectric film having a perovskite crystal structure represented by formula ABO$_3$ and containing at least one element selected from the group consisting of Pb, Ba, Sr, Mg and a rare-earth element as A and one or both of Ti and Zr as B formed between said MgO epitaxial film and said oxide superconductor film.

10. An electronic device substrate according to claim 6, further comprising a dielectric film having a perovskite crystal structure represented by formula ABO$_3$ and containing at least one element selected from the group consisting of Pb, Ba, Sr, Mg and a rare-earth element of A and one or both of Ti and Zr as B formed between said spinel epitaxial film and said oxide superconductor film represented by formula P$_x$(Q,Ca)$_y$Cu$_z$O$_\delta$.

* * * * *